United States Patent [19]
Zdebel et al.

[11] Patent Number: 4,740,478
[45] Date of Patent: Apr. 26, 1988

[54] INTEGRATED CIRCUIT METHOD USING DOUBLE IMPLANT DOPING

[75] Inventors: Peter J. Zdebel, Mesa; Raymond J. Balda, Tempe, both of Ariz.

[73] Assignee: Motorola Inc., Schaumburg, Ill.

[21] Appl. No.: 8,991

[22] Filed: Jan. 30, 1987

[51] Int. Cl.$^4$ .................. H01L 21/265; H01L 21/225
[52] U.S. Cl. ..................................... 437/33; 357/34; 357/91; 437/18; 437/20; 437/27; 437/31
[58] Field of Search .................. 437/27, 18, 20, 31, 437/33; 357/91, 34

[56] References Cited
U.S. PATENT DOCUMENTS

| Re. 30,282 | 5/1980 | Hunt et al. | 148/1.5 |
|---|---|---|---|
| 4,319,932 | 3/1982 | Jambotkar | 148/1.5 |
| 4,381,953 | 5/1983 | Ho et al. | 148/1.5 |
| 4,385,946 | 5/1983 | Finegan et al. | 148/175 |
| 4,445,967 | 5/1984 | Kameyama | 156/648 |
| 4,456,489 | 6/1984 | Wu | 148/1.5 |
| 4,477,965 | 10/1984 | Blossfeld | 29/576 B |
| 4,483,726 | 11/1984 | Isaac et al. | 148/187 |
| 4,545,113 | 10/1985 | Vora | 29/578 |
| 4,581,319 | 4/1986 | Wieder et al. | 430/314 |
| 4,590,666 | 5/1986 | Goto | 29/578 |
| 4,593,453 | 6/1986 | Tam et al. | 29/571 |
| 4,602,419 | 7/1986 | Harrison et al. | 29/571 |
| 4,602,421 | 7/1986 | Lee et al. | 29/576 |
| 4,604,641 | 8/1986 | Konishi | 357/59 |
| 4,604,789 | 8/1986 | Bourassa | 29/576 |
| 4,608,589 | 8/1986 | Goth et al. | 357/34 |
| 4,611,384 | 9/1986 | Bencuya et al. | 29/571 |
| 4,612,701 | 9/1986 | Cox | 29/576 |
| 4,629,520 | 12/1986 | Ueno et al. | 29/576 B |
| 4,648,909 | 3/1987 | Krishna et al. | 148/1.5 |
| 4,662,062 | 5/1987 | Toyooka et al. | 29/578 |
| 4,669,179 | 6/1987 | Weinberg et al. | 29/576 B |
| 4,675,981 | 6/1987 | Naruke | 29/576 B |

OTHER PUBLICATIONS

Ryssel et al, in Ion-Impc$^N$. in Semiconductors-, ed. Crowder, Plenum, N-7, 1972, p. 215.
"At IEDM, New Ways to Boost Chip Speed and Density", Electronics, Nov. 27, 1986, pp. 66–68.
A. K. Kapoor, "An Improved Single-Poly Bipolar Technology for Linear/Digital Applications", Proceedings of the 1986 Bipolar Circuits & Technology Meeting, IEEE, Sep. 11–12, 1986.
N. F. Gardner et al., "A 3.9 Gigahertz Practical Prescaler in an Oxide-Walled, Self-Aligned Emitter Technology", Proceedings of the 1986 Bipolar Circuits & Technology Meeting, IEEE, Sep. 11–12, 1986, Minneapolis, Minn.
H. K. Park et al., "High Speed Polysilicon Emitter—Base Bipolar Transistor", Proceedings of the 1986 Bipolar Circuits and Technology Meeting, IEEE, Sep. 11–12, 1986, Minneapolis, Minn., pp. 39–40.

Primary Examiner—Upendra Roy
Attorney, Agent, or Firm—Robert M. Handy

[57] ABSTRACT

A process is disclosed for fabricating improved integrated circuit devices. In accordance with one embodiment of the invention integrated devices are fabricated by a four layer poly process which produces small device areas without relying upon restrictive photolithography tolerances. A master mask is used to define the basic footprint of the device in combination with easy to align block-out masks in each lithography step. A double implant doping process is used to control the Gummel number in the base of bipolar transistors and like regions. A shallow implant is placed in a screen oxide and a deep implant into the desired base location. The dopant saturated screen oxide prevents segregation of the deep base implant during subsequent heat treatment. The double implant process applies to many desired device structures.

22 Claims, 13 Drawing Sheets

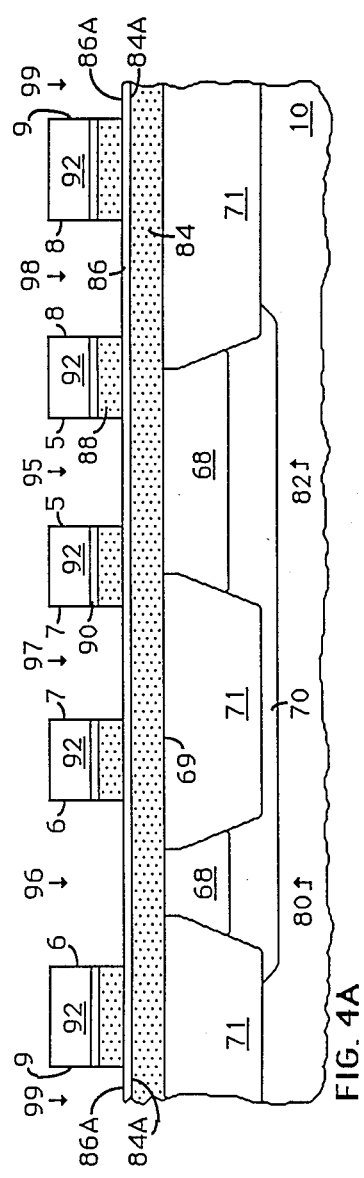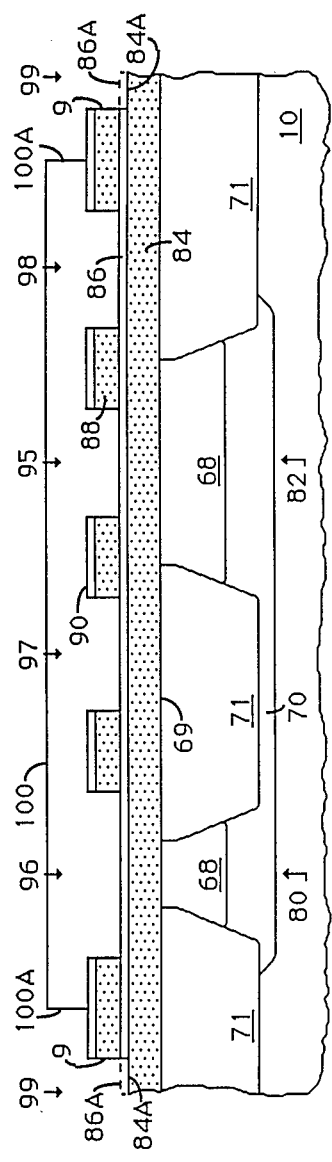
FIG. 4A
FIG. 5A

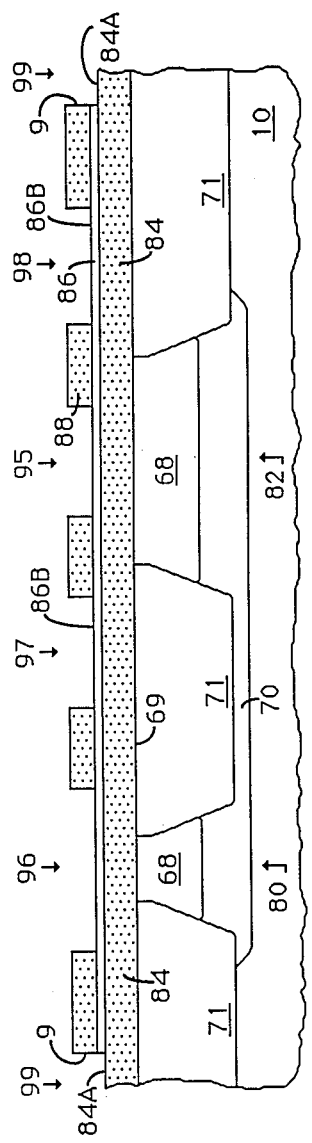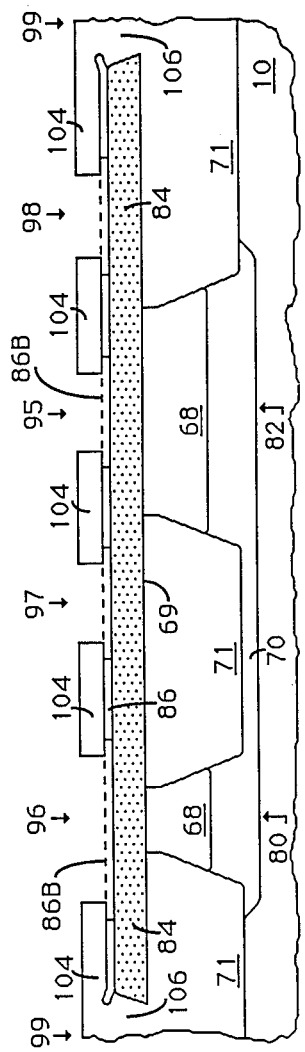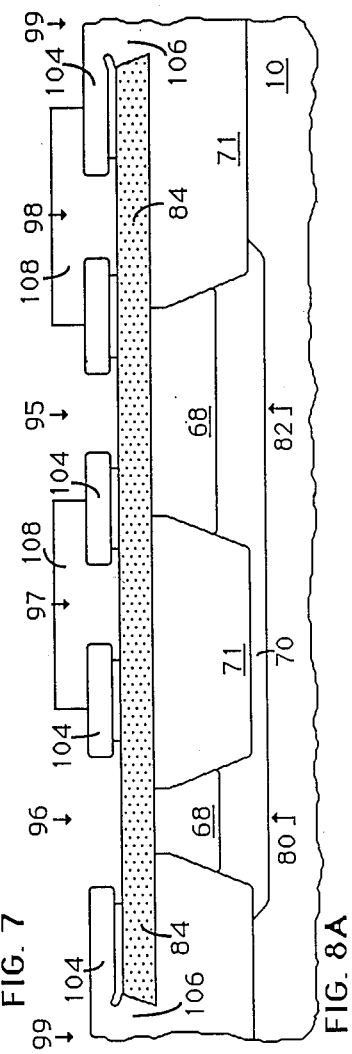

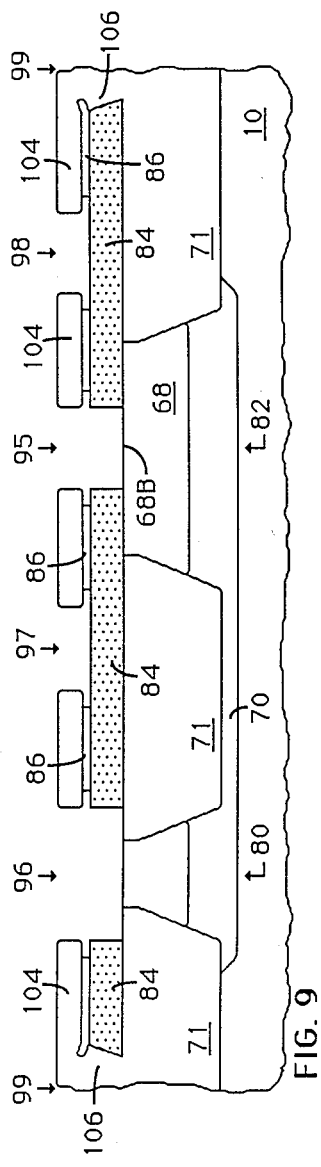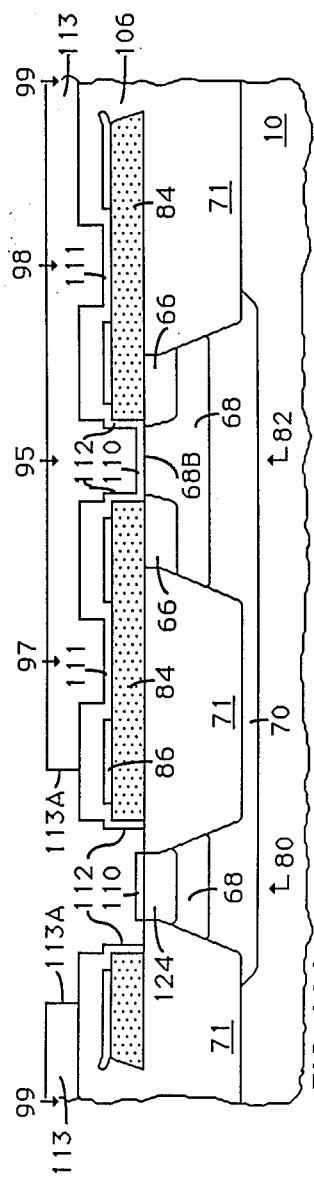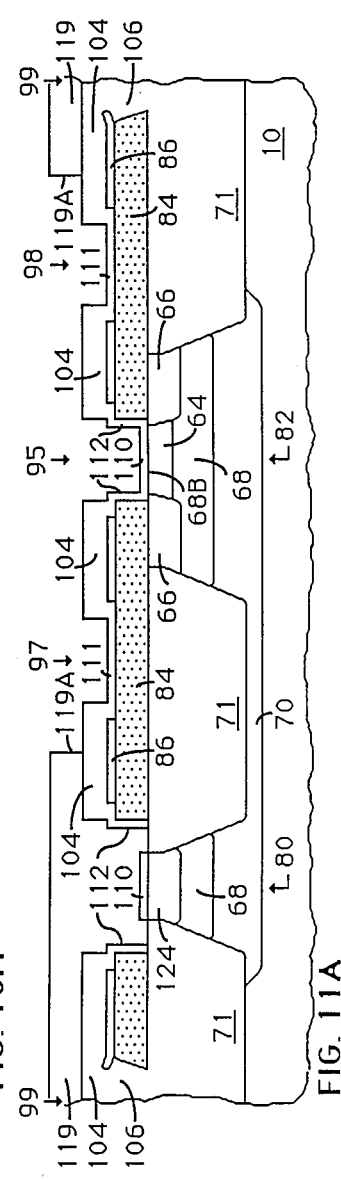

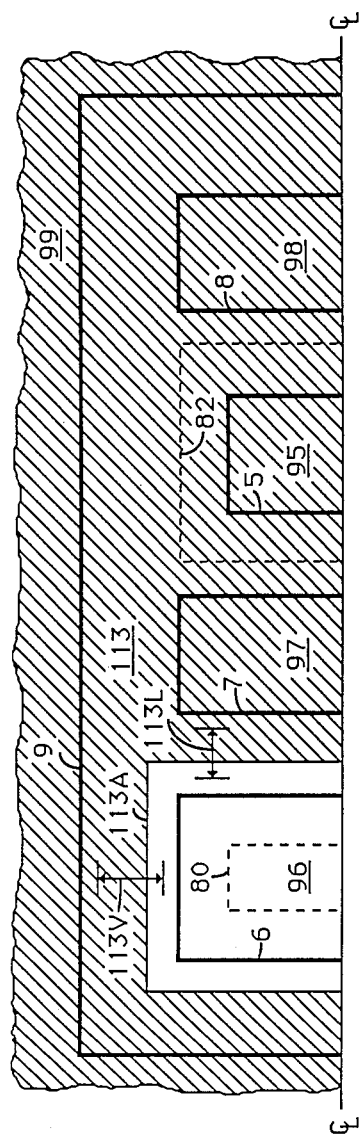
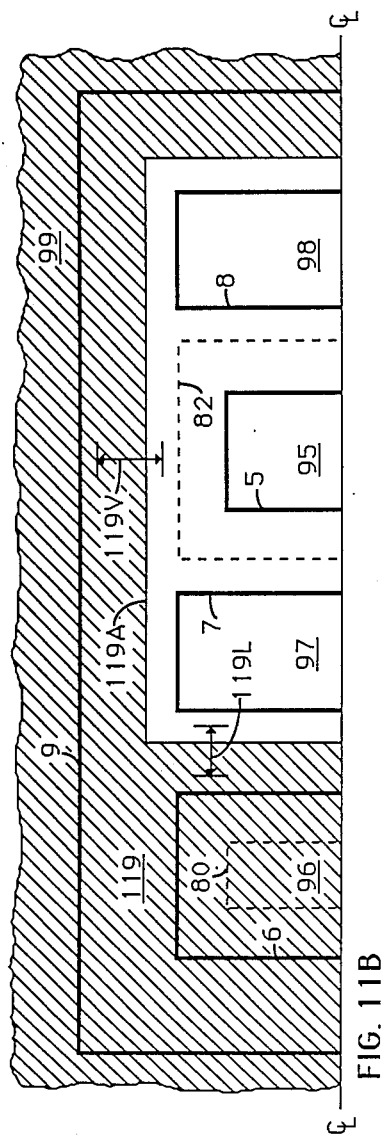

INTEGRATED CIRCUIT METHOD USING DOUBLE IMPLANT DOPING

The application by Peter Zdebel et al., entitled INTEGRATED CIRCUIT STRUCTURES HAVING POLYCRYSTALLINE ELECTRODE CONTACTS AND PROCESS, Ser. No. 071,009,322, is related.

BACKGROUND OF THE INVENTION

This invention relates generally to a process for fabricating an integrated circuit structure, and more specifically to an improved process for doping.

There is a need in the integrated circuit art for obtaining more precise control over the doping concentration and profile in semiconductor devices. While high temperature diffusion and ion implantation are widely used, they suffer from a number of limitations. For example, certain dopants tend to preferentially segregate into oxide which may be in contact with the doped region. Thus even where ion implantation is used for precise control of the initial amount of dopant that is introduced into the semiconductor, it is very difficult to maintain the proper amount in the desired region through subsequent heating cycles. This problem is exacerbated in very small device structures.

Small device size requires small device regions, precise alignment between regions, and minimization of parasitic resistances and capacitances. Device size can be reduced by putting more reliance on fine line lithography, but as device shrinking continues, it becomes impractical or impossible to continue to reduce feature size and achieve the required greater and greater alignment accuracy and dopant control. As lithography is pushed to the limit, yield and production throughput decrease.

In view of the desire for integrated circuits having higher device counts, smaller device sizes, and greater circuit performance, a need continues to exist for an improved process to manufacture the required devices without resorting to unrealistic photolithography requirements while still maintaining control over the local dopant concentration.

Accordingly, it is an object of this invention to provide an improved process and structure for fabricating integrated circuit devices.

It is another object of this invention to provide an improved process and structure for producing integrated circuit devices of reduced size with accurate dopant control.

It is yet another object of this invention to provide an integrated circuit process and structure for fabricating improved NPN and PNP transistors and other devices.

It is a still further object of this invention to provide an improved process and structure for fabricating polycrystalline silicon electrode contact devices in integrated form in conjunction with improved dopant control of single crystal device regions.

As used herein, the words "block-out mask" are intended to refer to a mask or its corresponding patterned resist image or equivalent, which provides one or more open regions and closed regions which need not be precisely aligned to preceding fabrication patterns or masks. A block-out mask is typically used to protect certain openings or predetermined areas of the structure created by one or more earlier masks from etching or implantation steps intended to proceed through the open regions of the block-out mask and other openings in the earlier masks or layers.

The words "intrinsic" or "internal" in connection with a base region or the like are used herein to refer to the active portion of the base of a transistor between the emitter and collector or equivalent. The words "extrinsic" or "external" or "extended" in connection with a base region or the like are used herein to refer to the inactive portion of the base or the like, for example, the portion of a bipolar transistor base laterally exterior to the intrinsic base region which is typically used to provide contact to the intrinsic base region.

BRIEF SUMMARY OF THE INVENTION

The foregoing and other objects and advantages of the invention are achieved through the improved process for fabricating semiconductor devices and the improved device structures disclosed herein.

In accordance with one embodiment of the process, a silicon substrate is provided and a field insulator region is formed therein extending to the substrate surface. A first layer of polycrystalline silicon, a layer of silicon nitride, and a second layer of polycrystalline silicon are deposited overlying the substrate surface and insulating field region. The upper surface of the first poly layer is doped with P type impurities. This layer is eventually used, for example, to dope an external base region in a vertical NPN transistor or equivalent, or the emitter and collector of a lateral PNP, and to provide an interconnection between a metallization and the active region of the transistor.

The second layer of polycrystalline silicon is patterned using a master mask to define a master electrode area which contains, for example, the emitter, collector, and base contact areas. The master mask provides the alignment between these device regions so that subsequent masking operations do not require critical mask alignment. Portions of the first poly layer outside the master electrode area are exposed and these exposed portions and the remainder of the second poly layer are converted to oxide throughout their thickness, preferably by thermal oxidation, to form a substantially planar structure. Polycrystalline silicon within the master electrode area is removed, for example, from the emitter and collector areas of the vertical NPN device or equivalent. Other polysilicon regions remain.

A screen oxide is formed overlying the exposed surface of the substrate and the edges of the remaining polycrystalline silicon exposed in the emitter, collector, or equivalent openings. An active base region is formed in the silicon substrate by doping through the screen oxide formed in the emitter contact opening.

Doping of the intrinsic base region is advantageously provided by a double implant process, the two implants having different penetration depths and amounts. One implant is a shallow implant into the screen oxide which covers the active base location during the base doping step. The other implant is deeper and deposits the bulk of its dose into the single crystal semiconductor region in which the active base is desired to be formed. Prior to activation or other significant heat treatment, the two implants may be performed in either order. Where boron doping is desired, $BF_2$ is preferably used for the shallow implant and $B^{11}$ for the deeper implant in order to have reasonable implant energies. The shallow implant saturates the screen oxide with dopant to retard dopant out-diffusion or segregation from the single crystal base region during subsequent heat treatment.

The deeper implant allows precise control of the Gummel number of the base to be maintained despite the subsequent heat treatment. Contact to the implanted intrinsic base region is made through a surrounding extrinsic base formed in the single crystal semiconductor substrate by diffusion from the first poly layer.

Additional semiconductor, dielectric and metal layers are applied and patterned to provide, for example, additional side-wall spacers to reduce the lateral width of various device openings, to provide an emitter region and a collector contact region, and to provide metal electrodes. The emitter is diffused generally through the same opening used for the base, but has a smaller lateral extent.

The double implant doping process may also be used to form other device regions besides a transistor base and for other devices.

BRIEF DESCRIPTION OF THE DRAWINGS

FIGS. 4B, 5B, 8B, 10B, 11B, 16B, and 17B illustrate masks or mask patterns used in fabricating semiconductor devices, especially the vertical NPN transistor of FIGS. 1–2 in accordance with the process of the invention.

FIGS. 3, 4A, 5A, 6–7, 8A, 9, 10A, 11A, 12–15, 16A, 17A, and 18 illustrate in simplified schematic cross-section, the vertical NPN transistor of FIGS. 1 and 2 during various stages of production, using the masks of FIGS. 4B, 5B, 8B, 10B, 11B, 16B, and 17B in accordance with the invention.

DETAILED DESCRIPTION OF PREFERRED EMBODIMENTS

The invented process and arrangements of layers and regions are useful for forming a wide range of device types and structures having utility as individual devices or in combinations. In order to facilitate understanding of how the process functions, construction of a vertical NPN transistor on a P-type substrate is described. However, those of skill in the art will understand, that the particular device example used is chosen for the purpose of explanation and is not intended to be limiting or infer that the process or arrangement is useful only for the exemplary devices.

A more detailed description of the transistor fabrication process and further examples of device structures which may be fabricated thereby is provided in a related co-pending application by Peter Zdebel, entitled "Integrated Circuit Structures Having Polycrystalline Electrode Contacts and Process", Ser. No. 009,322.

Figure 1:
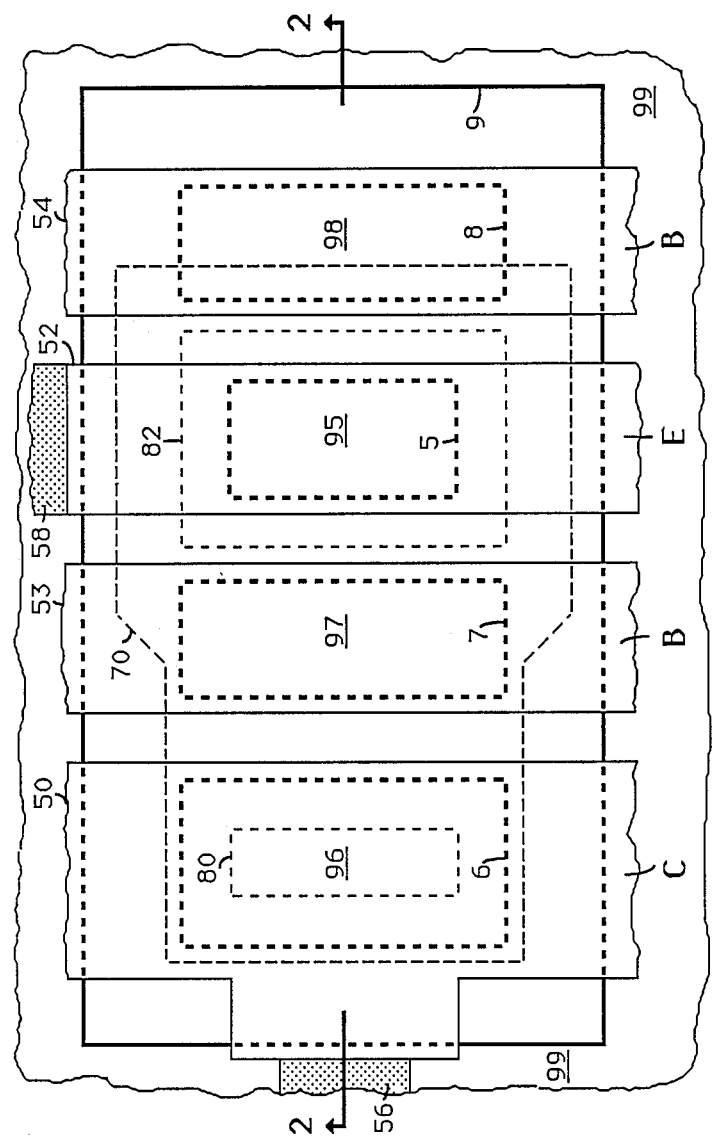
FIGS. 1 and 2 illustrate, in schematic top view and cross-section, respectively, a vertical NPN transistor fabricated in accordance with the invention.

FIG. 1 illustrates, in plan view, the top surface of an NPN transistor suitable for integration in accordance with one embodiment of the invention. The figure illustrates the overlay of several of the process masks utilized to achieve the completed device. The device includes collector contact 50, emitter contact 52, and two base contacts 53, 54. Optional polycrystalline silicon collector resistor 56 and emitter resistor 58 are also illustrated. Heavy solid and dashed lines 5–9 show the location of a master mask for defining openings 95–99 relative to buried layer 70, collector epitaxial island 80 and emitter epitaxial island 82, which are shown by lighter dashed lines. The various features of the structure will be more clearly understood by means of the cross-section shown in FIG. 2.

Figure 2:
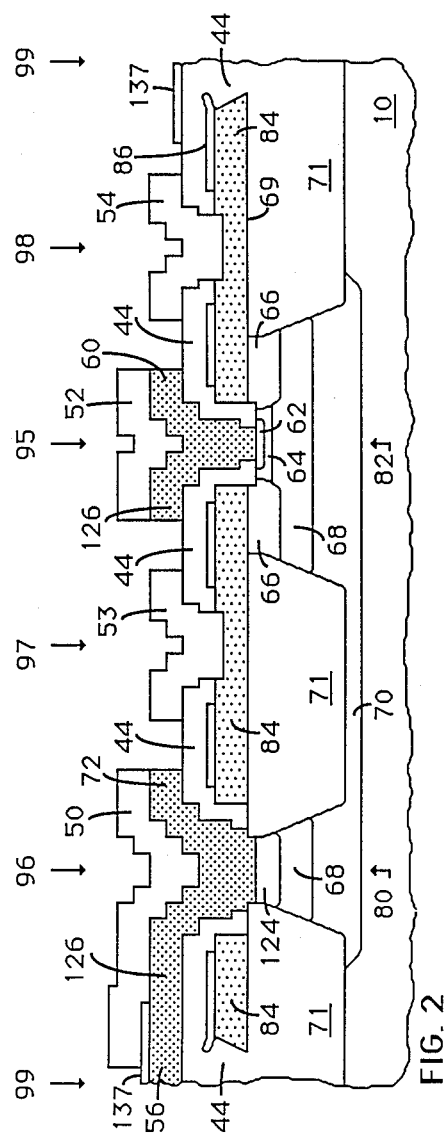

FIG. 2 illustrates a schematic cross-sectional view through the device of FIG. 1 on the centerline as shown. Emitter metal 52 contacts polycrystalline silicon region 60 which, as will be explained, is formed from fourth layer 126 of polycrystalline silicon. Poly region 60, in turn, contacts diffused emitter 62 of the bipolar transistor structure. Also illustrated are active base 64, extended base 66 and the collector. The collector includes N-type epitaxial region 68 and heavily doped N+buried layer 70. Region 71 is a dielectric isolation region, e.g., isolation walls. Region 84 is a polycrystalline semiconductor region for contacting extended base 66. Region 44 is a dielectric region separating poly region 84 from poly regions 60 and 72. Poly region 72 is another portion of fourth poly layer 126 which is formed between collector contact region 124 and collector electrode 50.

In FIG. 2, poly emitter contact 60, poly collector contact 72 and the sidewall portions of dielectric 44 may extend slightly downward below surface 69 into epi-region 68 in epi-islands 80 and 82. This is because a small amount of epi-region 68 in islands 80, 82 between dielectric isolation walls 71 is consumed during fabrication of the device, as for example during thermal oxidation of the substrate surface. For simplicity and because the amount is small, this detail is omitted from various device cross-sections shown later.

The left portion of FIG. 2 shows a cross-section through the collector contact. Collector contact metal 50 is in electrical contact with N type doped polycrystalline silicon region 72 which, like polycrystalline silicon region 60, was formed from fourth polycrystalline silicon layer 126. Poly silicon region 72 contacts collector contact region 124 and is in electrical contact with the active collector through the portion of epitaxial region 68 in epi-island 80 and through buried layer 70. Region 71 is a dielectric isolation region separating epi-islands 80 and 82 and isolating the device from other adjacent devices.

FIG. 2 illustrates, in cross-section, two base contacts to the exemplary vertical NPN transistor. Base contact metal 53, 54 directly contacts P-type polycrystalline region 84 which contacts extended base 66. Polycrystalline region 84 was originally formed from a first polycrystalline silicon layer. In the illustrated embodiment, base contact poly-region 84 surrounds emitter 62, but this is not essential.

The process steps used to achieve the structures illustrated in FIGS. 1 and 2 will now be briefly described.

The process is started in conventional fashion with the formation of buried layer 70, epitaxial collector layer 68, and recessed isolation walls 71. These initial steps are well known in the art and, therefore, are only described in general terms. FIG. 1 illustrates the composite of buried layer 70 and epi-islands 80, 82 protruding through isolation 71. Buried layer 70 is shown in subsequent cross-sections but for simplicity is omitted from the various illustrations of the masks used. Epi-islands 80, 82 are shown on the masks to provide a common reference. P+channel stops (not shown) may be provided under isolation 71 if desired. Those of skill in the art will understand how to accomplish this.

The NPN device is fabricated on P-type silicon substrate 10 having, typically, a resistivity of about 8–25 ohm centimeter. However, other resistivities can also be used depending upon the desired device characteristics. Using conventional masking and photolithography, N+buried layer 70 is formed, for example in the region shown in FIG. 1. N-type epitaxial layer 68 (see FIGS. 2) is grown overlying P-type substrate 10 and N+buried layer 70. The thickness and doping of the epitaxial layer are selected dependent upon the type of device being implemented. For a macrocell array fabricated in ECL technology, the epitaxial layer conveniently has a thickness of about 1-2 micrometers and a resistivity of about 0.2-1.5 ohm centimeter. Other thicknesses and resistivities may also be used.

Localized recessed oxide 71 (see FIG. 2) is formed to isolate between devices and within particular device structures. This is conveniently accomplished by thermal oxidation using means well known in the art. The resulting oxide isolated structure, illustrated in FIGS. 1-2 has field oxide generally surrounding epi-islands 80, 82.

Figure 3:
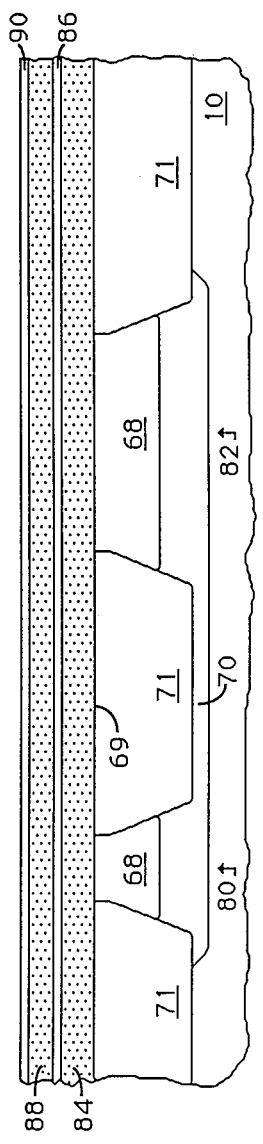

The surface of epi-region 68 is cleaned to avoid the formation of undesirable interfacial oxide between the epi-layer and layer 84 of polycrystalline semiconductor which will be subsequently deposited. Following cleaning, a series of layers are deposited on surface 69 of epi-region 68 and oxide region 71, as illustrated in FIG. 3. FIG. 3 shows a schematic cross-section corresponding to FIGS. 2, but at an earlier stage of fabrication.

Two layers 84, 86 are conveniently deposited on surface 69 using low pressure chemical vapor deposition (LPCVD). First layer 84 is a layer of polycrystalline semiconductor, preferably silicon having a thickness conveniently of about 385 nanometers. Second layer 86 is conveniently a layer of silicon nitride or a sandwich of oxide plus nitride or a layer of other oxidation resistant material having a thickness of, for example, about 70-120 nanometers. Poly silicon layer 84 will be used to form poly silicon base contact regions 84 of FIG. 2. Where an NPN transistor is being formed, layer 84 is doped by ion implantation of, for example, boron. The doping may be performed during or anytime after deposition of layer 84, but is conveniently performed after deposition of layers 84 and 86 through nitride layer 86 and before deposition of layers 88 or 90. Poly silicon layer 84 is conveniently doped with singly ionized boron at an energy of about 70 KeV to a dose of about $1 \times 10^{16}$ cm$^{-2}$, although other doping levels may also be used depending on the desired device and circuit characteristics. The implantation is preferably arranged so that the relatively high dose of boron is located near the upper surface of polycrystalline silicon layer 84, just below silicon nitride 86.

After the boron implantation, two further layers 88, 90 are deposited, for example by LPCVD, over silicon nitride layer 86. Layer 88 is desirably an undoped layer of polycrystalline silicon having a thickness conveniently of about 180 nanometers. Layer 90 is formed overlying poly layer 88. Layer 90 conveniently prevents contamination of poly layer 88 and serves as a hard mask for subsequent lithographic patterning of the underlying layers. Layer 90 may be of any material suitable for such purposes. Layer 90 is conveniently of silicon oxide having a thickness of about 20-40 nanometers.

Figure 4B:
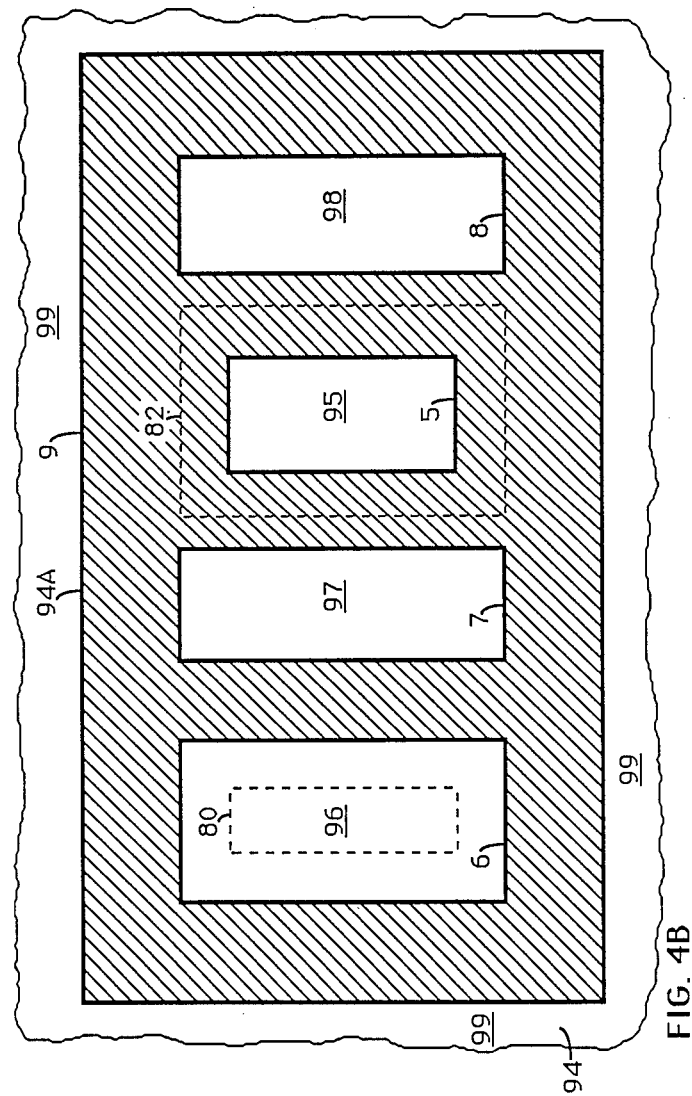

Processing of the structure continues with the application of layer 92 of photoresist overlying oxide layer 90 as shown schematically in FIG. 4A. The photoresist is patterned using master mask 94, represented by the shaded region in FIG. 4B, containing images 95-99 for locating various device regions. Master mask 94 provides self-alignment of the critical device areas, for example in the case of the vertical NPN transistor, the collector contact, the base contact or contacts, the emitter contact, and the emitter-base active region. In accordance with one embodiment of the invention, master mask 94 defines the master electrode area which includes emitter contact opening 95, collector contact opening 96, and base contact openings 97, 98 located within perimeter 9 and surrounded by external region 99. Region 99 identifies the region, outside perimenter 9 of master mask 94. Openings or windows 95-98 located within perimeters 5-8 respectively are used in the subsequent process to form the "footprints" of the device terminals, and in the case of the vertical bipolar device, the active emitter-base region. Perimeter 5, although referred to generally herein as the emitter opening or emitter contact opening, is used in conjunction with epitaxial island 82 formed within field oxide 71 to locate both the base and emitter of the device as well as the emitter contact. Base contact openings 97, 98 are located within perimeters 7, 8 respectively. Collector contact opening 96 is located within perimeter 6.

Master mask 94 is aligned to epi-islands 80, 82 as shown in FIG. 4B. In a preferred embodiment, the minimum geometry of any feature included in the master mask is a dimension, such as for example, about 1.5 micrometers, which can be processed easily with standard photolithography alignment tools. As will become apparent, fine geometry devices having features less than the minimum geometry size can be readily produced by the inventive process and structure without resorting to more difficult photolithography. The process may be readily scaled to smaller dimensions as lithographic and etch resolution improve.

A particular feature of the present invention is that the master mask automatically self-aligns the emitter, base, and collector contacts and outer device periphery, so that, when metal is subsequently applied thereto, only one alignment tolerance (master mask to metal mask) need be accommodated. This allows devices having smaller metal pitch and therefore smaller overall size to be constructed as compared to the prior art processes which do not provide such self-alignment of the emitter, base, and collector contacts and the device periphery.

Using master mask 94 to expose photoresist layer 92, the process continues by defining master mask pattern 94 in photoresist layer 92 and subsequently in layers 90 and 88, as illustrated schematically in FIG. 4A. In a preferred process the resist is used only to pattern oxide layer 90 and then is removed. Polysilicon layer 88 is subsequently patterned by reactive ion etching or other suitable differential etching means, using patterned layer 90 as an etch mask.

Emitter window 95 is desirably located so as to be laterally within epitaxial island 82 and surrounded by but not over field oxide 71. Collector window 96 is located so as to at least partly overlap island 80. It is desirable that window 96 laterally enclose island 80 and extends beyond island 80 over adjacent field oxide 71. Base windows 97, 98 are desirably located over a portion of field oxide 71. The significance of these desirable relationships between the master mask windows and the field oxide will become apparent in the following description. Reactive ion etching of polysilicon layer 88 stops automatically when nitride layer 86 is exposed because of the differential etch rate for polycrystalline silicon and silicon nitride.

Master mask 94 is thus replicated in second poly layer 88 as illustrated in FIG. 4A, and the alignment of the remaining photolithography steps are thereafter relatively non-critical. The critical alignment between device regions is established automatically by master mask 94 in combination with epi-islands 80 and 82.

Figure 5B:
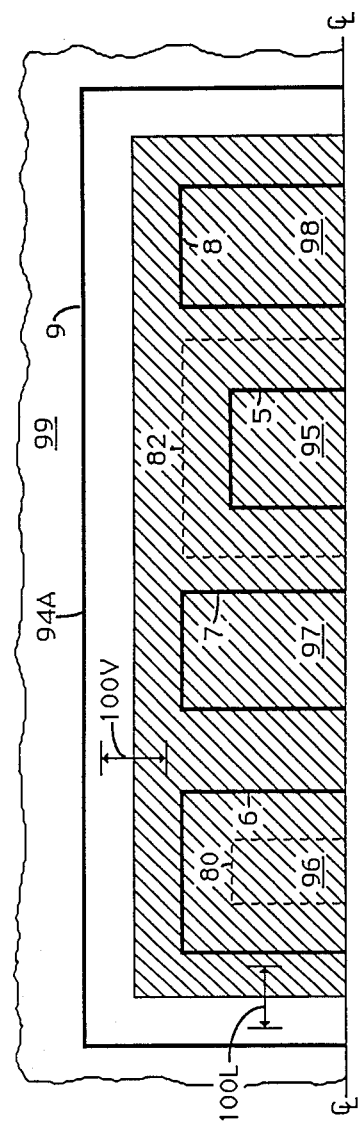

The process is continued by the use of first block-out mask 100 as illustrated in FIGS. 5A-B. FIG. 5B is a top view showing first block-out mask 100, represented by the shaded area, overlaid on master mask 94 (as replicated in oxide 90, and represented by the heavy outlines), and on epi-islands 80, 82 (represented by the light dashed outlines). This same convention for showing the relative location of the current mask, the master mask image and the epi-islands is followed in subsequent figures. First block-out mask 100 protects the open portions within master electrode perimeter 9, covering emitter window 95, collector window 96, and base windows 97-98. The large allowable tolerance in alignment of mask 100 with respect to the etched result from the proceeding use of master mask 94 is illustrated by arrows 100V and 100L. Edge 100A of mask 100 should be aligned to fall on the portion of oxide layer 90 which remains laterally exterior to openings 95-98.

As illustrated in FIGS. 5A-B., first block-out mask 100 is used in conjunction with the remaining portions of oxide layer 90 and poly layer 88 as an etch mask to permit removal of portion 86A of silicon nitride layer 86 which is not protected by mask 100 or oxide 90 and poly layer 88. The exposed nitride is etched by any convenient method, as for example, reactive ion etching. This removes portion 86A of nitride layer 86 and exposes corresponding portion 84A of layer 84 in region 99 outside border 9 of master electrode area 94. Subsequently, photoresist 100 is removed.

The result of the preceding steps is shown in FIG. 6. Within the confines of master electrode area 94, remaining portions of polysilicon layer 88 are exposed while portions 86B of nitride layer 86 still cover part of polysilicon 84 and protect it from oxidation.

The structure is then oxidized to convert the exposed polysilicon to a dielectric, e.g., silicon dioxide, as illustrated in FIG. 7. The polysilicon which is oxidized includes the remaining portions of poly layer 88 as well as portions 84A of poly layer 84 exposed outside edge 9 of master electrode area 94. The silicon dioxide which results from this oxidation step includes oxide layers or regions 104 and 106. Oxide layer 104 having, for example, an oxide thickness of about 400 nanometers results from the oxidation of the remaining portions of poly layer 88. Oxide region 106 having, for example, an oxide thickness of about 855 nanometers results from the oxidation of exposed portion 84A of poly layer 84.

The oxidation of the two polycrystalline silicon layers is preferably done using a relatively low temperature, high pressure oxidation process to minimize the total amount of time the structure is exposed to elevated temperatures. Use of high pressure (e.g., about twenty-five atmospheres) results in comparatively rapid oxidation at comparatively low temperature (e.g., about 750° C.). Other temperatures and pressures may be used, but limiting the time at elevated temperatures is important to prevent excessive redistribution of the boron already implanted at the upper surface of polycrystalline silicon layer 84. It is important that redistribution of this implanted dopant be limited so that the boron dopant does not substantially diffuse into single crystal silicon epitaxial layer 68 at this time.

During the oxidation step, polycrystalline silicon region 84A and the remaining parts of layer 88 are conveniently oxidized simultaneously. Layer 84 is oxidized only in region 84A beneath region 99 outside master electrode area 94 where portion 86A of nitride layer 86 has been removed. The remaining part of nitride layer 86 within master electrode area 94 protects the remainder of poly layer 84 over what will become the active transistor area, and only poly layer 88 is oxidized within master electrode area 94. The oxidation step is self-limiting with respect to poly layer 88, since it terminates when the oxidation front reaches underlying silicon nitride layer 86. The oxidation of exposed portion 84A of poly layer 84 is also self limiting and substantially stops when the entire thickness of portion 84A of poly layer 84 is consumed by the oxidation and the oxidation front reaches underlying field oxide 71.

The above-described oxidation of parts of poly layers 84 and 88 is designed, in accordance with the invention, to provide a substantially planar surface. During oxidation of portions of poly layers 84 and 88 to form oxide regions 106 and 104, the volume occupied by the oxide expands to approximately 2.2 times the volume occupied by the silicon from which the oxide is derived. This increase in volume is taken into account in selecting the thicknesses of the various layers so that the resulting surface is substantially planar. Accordingly, the thickness of poly layers 84, 88 and silicon nitride layer 86 are selected so that, after oxidation, the thickness of oxide 106 formed from poly 84A is about equal to the combined thickness of oxide 104, formed from poly 88, plus silicon nitride layer 86 plus the remaining (unoxidized) portion of poly layer 84. The resultant surface, except for a minor discontinuity at the intersection between oxides 104 and 106, is substantially planar. Although specific thicknesses or thickness ranges have been indicated in this preferred embodiment for layers 84, 86, 88, other thicknesses of these layers having the relationship described above can also be utilized.

Another important feature of the invention is that, during the oxidation of poly layer 88, the emitter opening defined in this layer is reduced in width by the lateral encroachment of the thermally grown silicon dioxide. The oxidation of 180 nanometers of, for example, polycrystalline silicon in layer 88 results in about 400 nanometers of silicon dioxide in layer 104. The increase in thickness of oxide 104 as compared to poly silicon layer 88 of about 220 nanometers also produces a lateral expansion of the silicon dioxide into the emitter opening by an equal amount. The emitter opening, therefore, is reduced in width by about twice the increase in thickness since the oxide encroaches equally from both sides of the emitter opening. This is a first step, in accordance with the invention, in reducing the feature size below that produced by the photolithographic process.

Portions 86B of silicon nitride layer 86 which are exposed in emitter opening 95, collector opening 96, and base openings 97-98 are removed by etching, (See FIGS. 6-7 and 8A). The exposed nitride is etched using previously formed oxides 104 and 106 as etch masks. Isotropic etching results in the remaining portions of layer 86 under oxide regions 104 to be slightly undercut, as is shown in FIG. 6. However, anisotropic etching, such as for example reactive ion etching, may also be used in which case there is substantially no undercutting of nitride layer 86 beneath oxide regions 104.

Figure 8B:
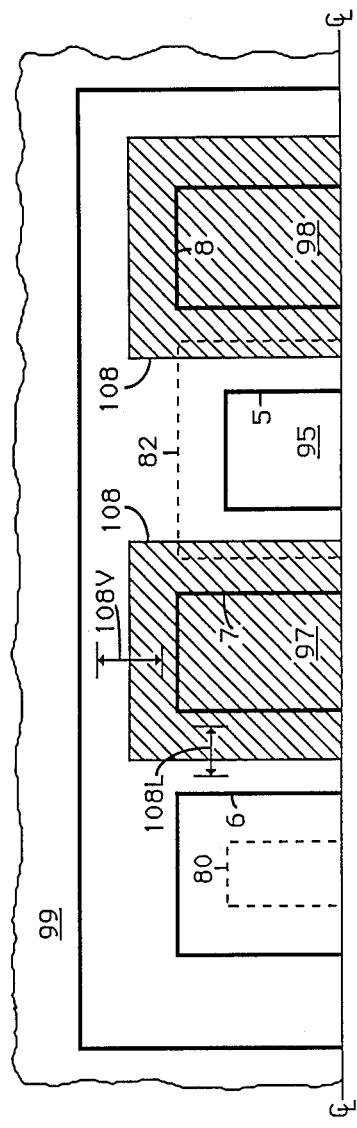

Photoresist is then applied to the surface of the substrate and patterned using a second block-out mask to leave patterned photoresist block out mask 108 protecting base contact area 97, 98 (see FIGS. 8A–B). Second block-out mask 108 is shown by the shaded area in FIG. 8B and in cross-section in FIG. 8A. Alignment of block-out mask 108 is not critical, it only being necessary that mask 108 cover base contact openings 97, 98 without interfering with adjacent collector contact opening 96 or emitter contact opening 95. The photoresist of the second block-out mask can conveniently cover all areas of the device except emitter and collector contact openings 95, 96 and other areas of polysilicon layer 84 which are desired to be etched if any. The available alignment tolerance is indicated approximately by arrows 108V and 108L.

Mask 108 protects polycrystalline silicon layer 84 over the base contact area and any other location where contact is desired to be made to first poly layer 84. The portions of polycrystalline silicon layer 84 exposed in emitter opening 95 and collector opening 96 are etched to expose the surface of underlying monocrystalline silicon region 68 (see FIG. 9). Reactive ion etching is a convenient technique, but other methods may also be used. The polysilicon removal process should be carefully controlled to avoid significant etching of underlying monocrystalline silicon 68 because such etching may be deleterious to the operation of the resulting transistor. Reactive ion etching is anisotropic and results in substantially vertical walls at the edges of openings 95, 96 through polycrystalline silicon layer 84, as illustrated schematically in FIG. 9. Because of mask 108, polycrystalline silicon 84 is not etched from base contact area 97, 98. Oxide 104, formed from the oxidation of polycrystalline layer 88, is used as an etch mask during the etching of polycrystalline silicon layer 84. As noted previously the lateral dimensions of openings 95–98 in layer 84 are reduced by the sideways growth of oxide 104 in the openings. Mask 108 is then removed.

The structure of FIG. 9 is conveniently oxidized to form screen oxide layer 110 on the exposed monocrystalline silicon in emitter opening 95 and collector opening 96. Oxide 111 is formed on the portion of polycrystalline silicon 84 exposed in base contact region 97, 98, and oxide 112 is also formed on the exposed sidewalls of polycrystalline silicon 84. The result is shown schematically in FIG. 10A. The three oxides are preferably formed simultaneously by thermal oxidation, although other techniques can also be used. Oxide 110 conveniently has a thickness of about 40 nanometers. Oxides 111 and 112 will typically have a slightly greater thickness because polysilicon, particularly when boron doped, generally oxidizes more rapidly than single crystal silicon. Oxide 110 is used as a screen oxide for doping of region 68 under openings 95, 96. Region 64 (see FIG. 11A) is subsequently formed under opening 95 through screen oxide 110 using a double implant doping process which will be explained more fully later.

Oxide 111 prevents etching of polycrystalline silicon layer 84 in a subsequent silicon etch. Oxide 112 forms a lateral side-wall liner oxide to isolate polysilicon layer 84 from the adjacent emitter and collector sites to be subsequently formed. The enhanced oxidation of poly layer 84 is advantageous in this application, as it increases the lateral thickness of the sidewall liner oxide 112.

During this oxidation step and during an anneal following the previous reactive ion etch, the boron implanted in polycrystalline silicon layer 84 is distributed throughout that layer and into underlying epitaxial silicon 68 to form external or extrinsic base region 66 (see FIG. 10A). Defining collector contact area 96 at the master mask step so that the edges of contact area 96 are located on field oxide 71 (and the subsequent replication of that pattern in poly layer 84) insures that none of the P-type doping from layer 84 is diffused into the N-type collector contact area. This is a particular feature of this embodiment of the present invention.

Photoresist is again applied to the surface of the device and is patterned using third block-out mask 113, as illustrated in FIGS. 10A–B. Mask 113, shown by the shaded area in FIG. 10B and in cross-section in FIG. 10A, covers all of the device area except for collector contact region 96. Opening 113A through third block-out Mask 113 exposes collector epitaxial island 80. The third block-out mask is designed with a wide alignment tolerance, as indicated by arrows 113V and 113L. Photoresist or other suitable masking material patterned by block-out mask 113 is used as an ion implant mask for the implantation of deep collector contact 124 (see FIG. 10A). For an NPN transistor, phosphorous is conveniently implanted into collector epitaxial island 80 to form heavily doped collector contact region 124 locally extending all or part way through epitaxial layer 68 in island 80 to underlying buried layer 70. Redistribution of the implanted phosphorous is carried out during subsequent high temperature processing steps to insure penetration to underlying layer 70. This detail is omitted in the figures.

Third block-out mask 113 is cleaned from the surface and an additional layer of photoresist or other masking material is applied. The new photoresist layer is patterned with a fourth block-out mask as illustrated schematically in FIGS. 11A–B. Fourth block-out mask 119 covers collector island 80 and contact area 96 and has opening 119A to expose emitter island 82, emitter contact 95, and base contact areas 97, 98. Again, a large alignment tolerance is allowed for block-out mask 119, as indicated schematically by arrows 119V and 119L. Fourth block-out mask 119 is used to protect the remainder of the device during implantation of active base region 64 (see FIG. 11A). Oxide 110 in opening 95 acts as a screen oxide and is doped during the base implantation and has other useful functions, as will be subsequently explained.

Figure 12:
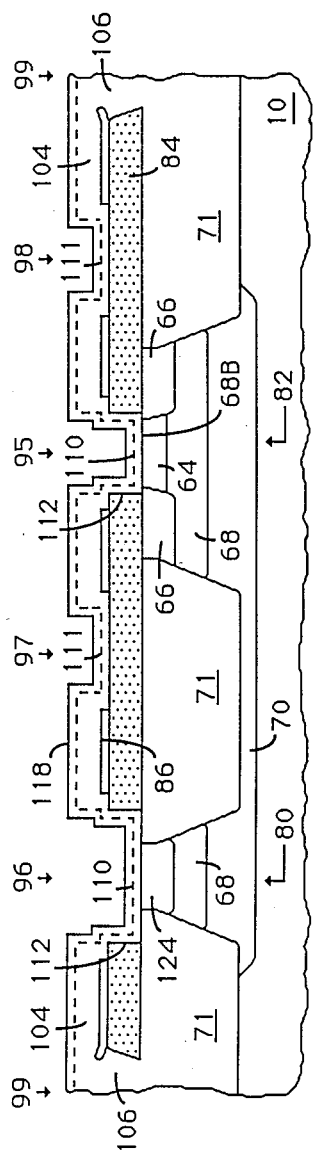
Figure 13:
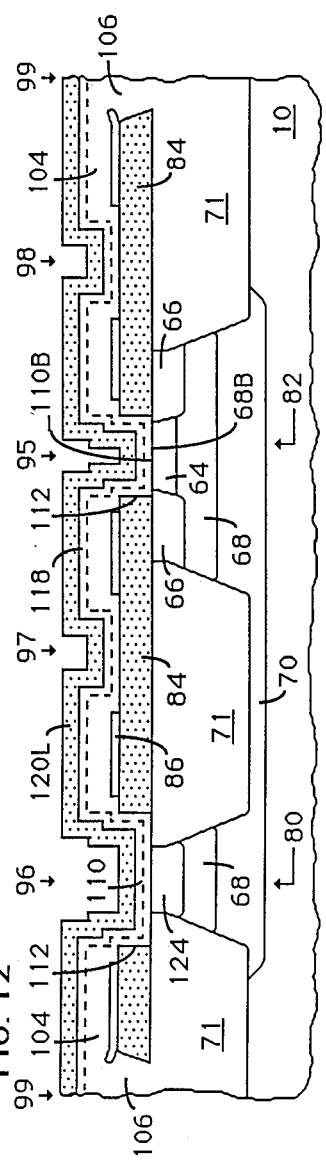

After base implantation, two additional layers are next formed overlying the surface of the device structure (see FIGS. 12–13). First, layer 118, preferably of silicon oxide and having a thickness of about 100 nanometers is deposited, preferably by LPCVD although other techniques may also be used. This is covered, in turn, with layer 120L, preferably of polysilicon and having a thickness of about 250 nanometers. Layer 120L is referred to as the third poly layer. Layer 120L need not be doped.

Layer 118 provides an additional oxide liner or spacer to increase the lateral isolation between boron doped base contact polycrystalline silicon 84 and the emitter and collector contacts to be subsequently formed. Layer 118 also serves to increase the vertical isolation thickness between layer 120L and the extrinsic base region being formed in underlying epitaxial region 68 outside intrinsic base region 64. When formed of polysilicon, layer 120L is conveniently deposited by low pressure chemical vapor deposition (LPCVD). This is a conformal deposition and, after anisotropic etching, provides an additional sidewall spacer in the emitter region and collector contact regions, as shown in FIG. 14 and explained below.

Layer 120L is anisotropically etched, typically by reactive ion etching. Because of the anisotropic nature of the etch, layer 120L is removed from lateral surfaces, leaving material 120 (e.g., polycrystalline silicon) on the vertical surfaces. The resultant structure is illustrated in FIG. 14. The result of the two depositions, i.e., layers 118 and 120L, is to further reduce the width of the emitter opening 95. Layer 120L is desirably formed from polysilicon because it is easily deferentially etched with respect to the underlying layers. Other materials having this same feature could be used in place of polysilicon for layer 120L.

Figure 14:
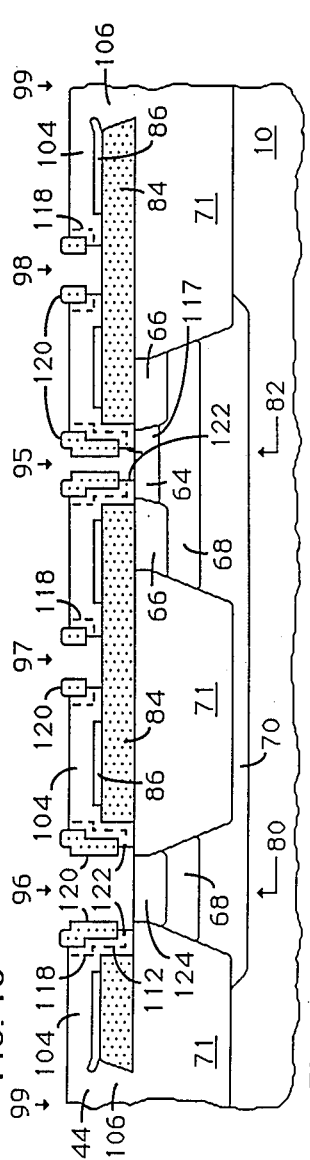

Referring now to FIG. 14, deposited oxide 118 is conveniently etched, preferably by anisotropic means such as reactive ion etching, without a photoresist mask, to expose the underlying thermal oxide 110. Thermal oxide 110 is then conveniently etched (e.g., by wet or dry etching) to expose surface 68B of monocrystalline silicon region 68 under emitter contact hole 95 and collector contact hole 96 and to expose polycrystalline silicon layer 84 in base contact regions 97, 98. If isotropic etching is used it partly undercuts the oxide under remaining portion 120 of polycrystalline silicon layer 120L as shown in FIG. 14, but leaves a portion of oxide 112 along the sidewall of polycrystalline silicon layer 84 in emitter opening 95 and collector opening 96 as well as a portion of doped oxide 110 adjacent the monocrystalline silicon region at the periphery of emitter contact region 95. However, anisotropic etching may be used in which case there is essentially no undercutting of the oxide beneath poly region 120, or a combination of anisotropic and isotropic etching may be used to control the amount of undercutting if that is desired.

The remaining portion of oxide 110 is here labeled with the number 122. If reactive ion etching is used for layer 118 and/or 110, the etching should be timed so as not to entirely etch the oxide down to the monocrystalline silicon, but leave at least some of the thermal oxide 110 to protect the surface of the monocrystalline silicon from the reactive ion etch. The subsequent etch of the remaining oxide should also be controlled, as the actual emitter area is defined by the lateral etching of oxide layers 110 and 118 beneath the remaining polysilicon portions 120. A low bias dry etch or a wet etch should be used to finally clear layer 110 in openings 95-98.

The summation of all the elevated temperature steps for deposition, anneal, and/or specifically for redistribution, serve to redistribute the boron dopant to form the active base 64 and the extended base 66. The same high temperature conditions also serve to drive-in or further redistribute the ion implant for deep collector contact 124. Active (intrinsic) base 64 results from the redistribution of the base ion implant. Extended (extrinsic) base 66 results from out-diffusion of boron dopant from overlying boron doped polycrystalline silicon layer 84. The presence of remaining portion 122 of boron rich oxide 110 performs the important function of preventing the depletion of dopants from monocrystalline silicon portion 117 in the region where the active and extended bases meet, i.e., between active base 64 and extended base 66. This avoids excessive resistance between active base 64 and extended base 66 and minimizes the contribution to unwanted base resistance from this region.

Intermediate portion 117, however, is more lightly doped than the remainder of the extended base and serves as a spacer between heavily doped extended base 66 and the highly doped emitter to be subsequently formed. The spacing between heavily doped extended base region 66 and the heavily doped emitter is necessary to maintain acceptable base-emitter junction characteristics. The creation of this spacer having a controlled intermediate doping is a particular feature of this embodiment of the invention. For simplicity, in FIGS. 15–22 and 2, the number 44 is used to refer collectively to the remaining portions of oxide or dielectric regions 104, 106, 110, 118, and 122 which are depicted in detail in FIGS. 14 and prior views.

Figure 15:
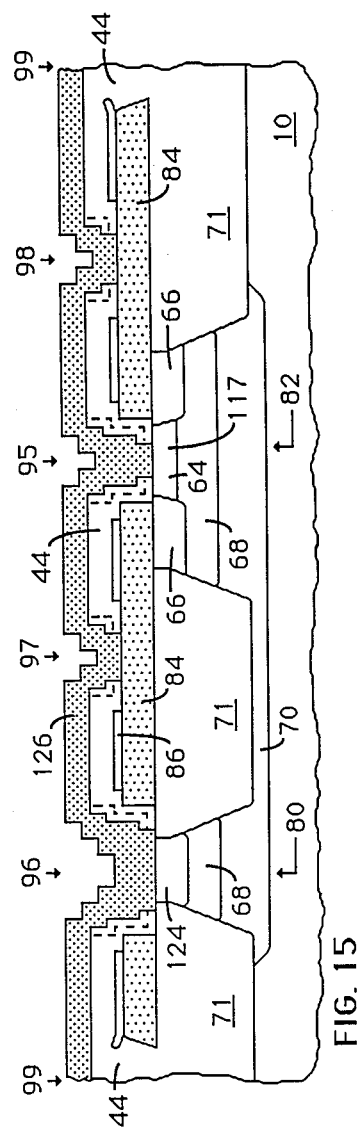
Figure 16A:
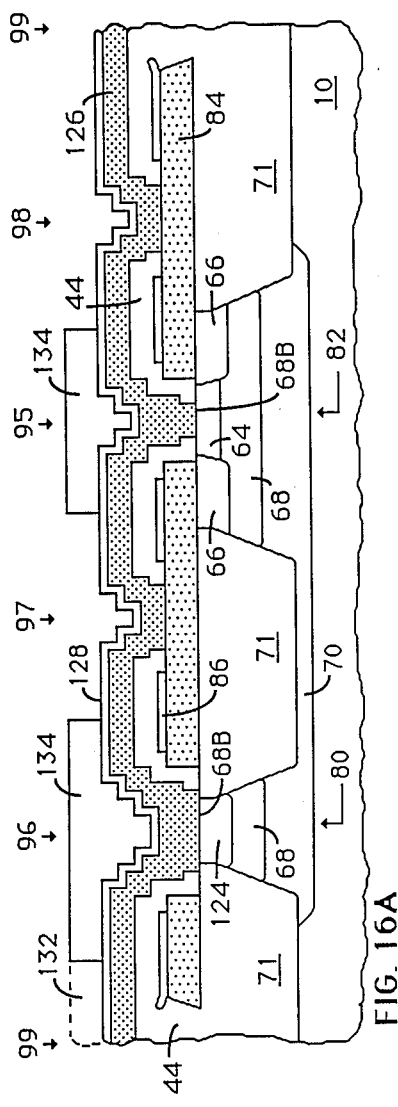

Fourth layer of polycrystalline silicon 126 and overlying layer 128 of silicon oxide are deposited, for example by LPCVD on layer 44 (See FIGS. 15–16A). Polycrystalline silicon layer 126 has a thickness of about 200–300 nanometers and is used to form the emitter contact, collector contact, and, where desired, emitter and collector resistors. Polycrystalline silicon layer 126 may be deposited doped or deposited undoped and subsequently generally or locally doped. For emitter and collector contacts on NPN devices arsenic doping is convenient. Layer 128 functions as a protective layer or screen for subsequent ion implants and serves as an etch mask for the patterning of poly layer 126.

Figure 16B:
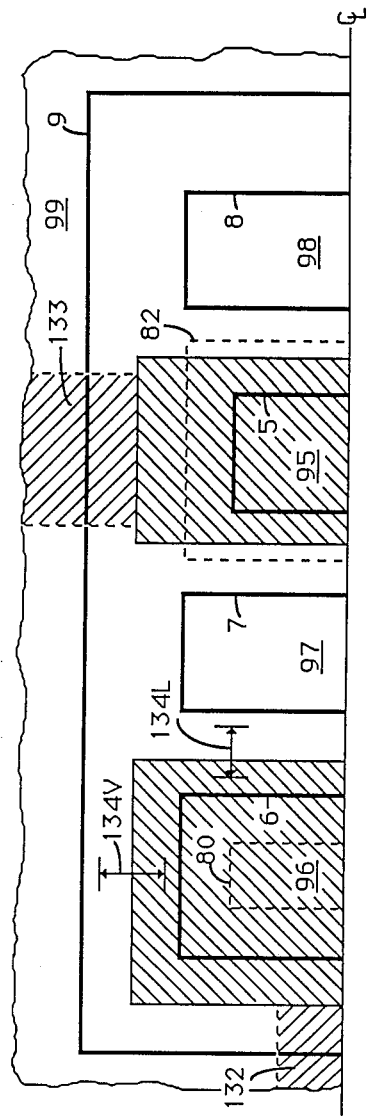

A blanket arsenic implant is conveniently applied at this time to dope layer 126. Thereafter, a layer of photoresist is applied to the surface of the device and fifth block-out mask 134 as illustrated in FIGS. 16A-B is used to pattern the photoresist. Fifth block-out mask 134 protects the portion of oxide 128 (and poly 126) in collector contact opening 96 and emitter contact opening 95. Fifth block-out mask 134 may also include portions 132 and 133 (see FIGS. 16A-B) to protect collector poly resistor region 56 and/or emitter poly resistor region 58 (see FIG. 2). Fifth block-out mask 134 is aligned to master mask 94 and allows for considerable alignment tolerance as illustrated by arrows 134V and 134L.

Patterned resist block-out mask 134 is used to mask oxide layer 128 which is then etched in the regions outside of resist 134 by, for example, reactive ion or wet chemical etching. Other etching methods can also be used. In a preferred embodiment, mask 134 is then removed and underlying patterned oxide layer 128 is used as an etch mask to pattern polycrystalline silicon layer 126. As a result of this patterning step, arsenic doped polycrystalline layer silicon 126 is left contacting the emitter region and the collector region respectively and is elsewhere removed. The result is illustrated in FIG. 17A.

The structure is annealed to redistribute the arsenic in polysilicon 126, and to drive the arsenic into surface 68B of monocrystalline silicon region 68 to form emitter region 62 within active base 64 and precisely spaced between and aligned with extended base region 66. Arsenic is also driven from polysilicon layer 126 into collector contact 124 below opening 96 to further enhance the conductivity of that region.

Figure 17B:
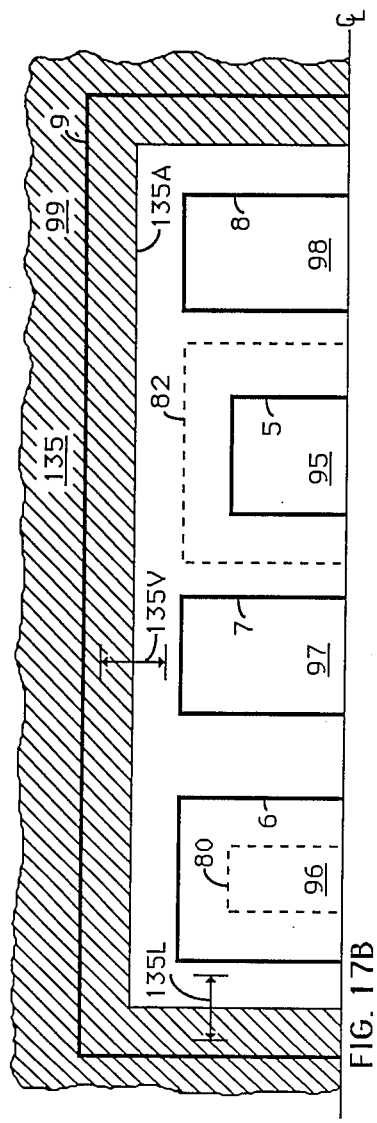
Figure 17A:
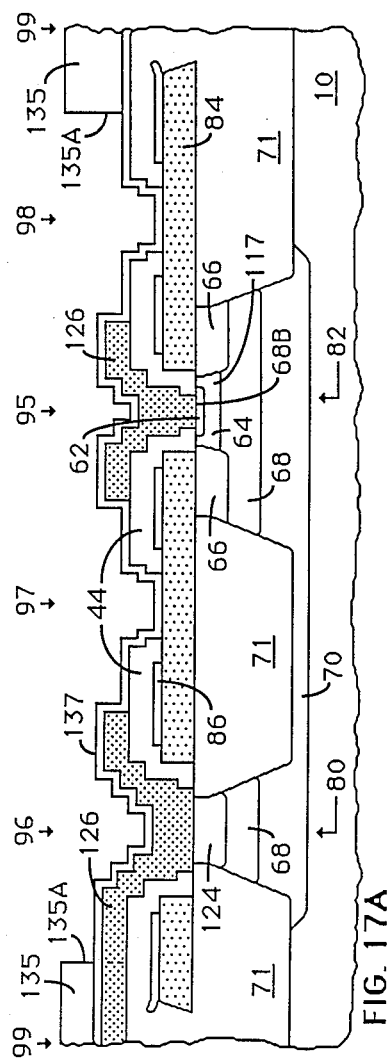

After removal of the undesired portions of layer 128 as described above, passivating layer 137, preferably a layer of silicon nitride, is formed overlying the structure (see FIG. 17A). Layer 137 is patterned using sixth block-out mask 135 illustrated in FIGS. 17A-B. Etching through sixth block-out mask 135 provides single open window 135A in layer 137 over the transistor to simultaneously expose emitter, collector, and base contact areas. It is not necessary, as is common with prior art processes, to open individual windows to each of contact areas 95-98; single large window 135A is sufficient. This is because the device areas outside of the individual contacts are not harmed by the subsequent etching steps and need not be separately covered. This avoids having to open very small individual contact windows which is more difficult to do. Thus, yield is enhanced by this approach which is a particular feature of an embodiment of this invention. As indicated by arrows 135V and 135L, alignment of sixth block-out mask 135 to the master mask pattern need not be precise.

Figure 18:
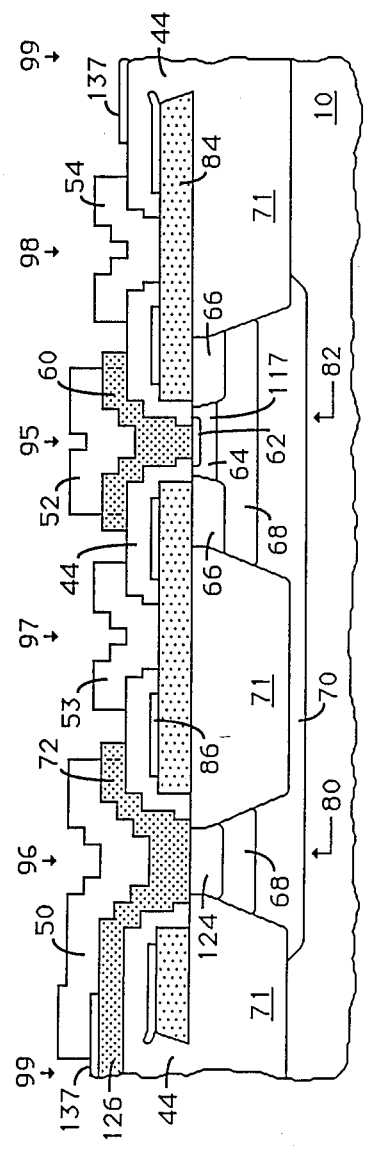

A layer of metallization is applied to the device surface, overlying silicon nitride layer 137 and extending into the contacts through opening 135A in silicon nitride layer 137. Aluminum is useful for the metallization, but other conductors can also be employed. The metal layer is patterned lithographically to leave stripes 52, 50, and 53-54 of metal overlying the emitter, collector, and base electrode regions, respectively, as illustrated in FIGS. 1, 2 and 18. FIGS. 2 and 18 also illustrate the remaining portions of silicon nitride passivation layer 137 surrounding the contact area outside of boundary 135A. Metal contact electrodes 52, 50, and 53-54 are formed with minimum metal width and a minimum spacing between adjacent metal runs, commensurate with the spacing on the original master mask.

In the final structure, as illustrated in FIGS. 1 and 2, contact to base region 64 of the transistor is made through base metal stripes 53 and 54. These metal stripes contact boron doped polycrystalline silicon base electrode 84 which in turn contacts extended base 66, and which in turn contacts active base 64. Heavily doped polysilicon region 84 and heavily doped extrinsic base regions 66 extend the base connection to active base 64 at a location immediately adjacent emitter 62, thus minimizing unwanted base resistance. Emitter 62 is contacted by metal stripe 52 through heavily doped polysilicon electrode 60 formed from layer 126. In a similar manner, transistor collector region 68 in epi-island 82 is contacted by a metal stripe 50 through heavily doped polycrystalline silicon electrode 72 formed from layer 126, deep collector contact 124, and buried layer 70. While collector contact diffusion 124 is shown in these figures as extending only partway through epi-region 68 in island 80, those of skill in the art will appreciate that with each thermal cycle following its implantation, region 124 progresses deeper into the substrate until by the end of the process the whole region of epi-island 80 between the surface and buried layer 70 has enhanced doping. The doping in region 124 is further enhanced by dopant from fourth poly layer 126. These combine to minimize collector series resistance in epi-island 80. For simplicity, this detail has been omitted from the figures. Contacts to the base, emitter, and collector are all self-aligned and minimize unwanted resistance.

The device structure and process described above illustrate the fabrication of an NPN transistor in accordance with specific preferred embodiments of the invention. In accordance with further embodiments of the invention, many variations in this basic process are contemplated, as well as additional active and passive devices which can be simultaneously fabricated as part of an integrated circuit or the like.

Figure 19:
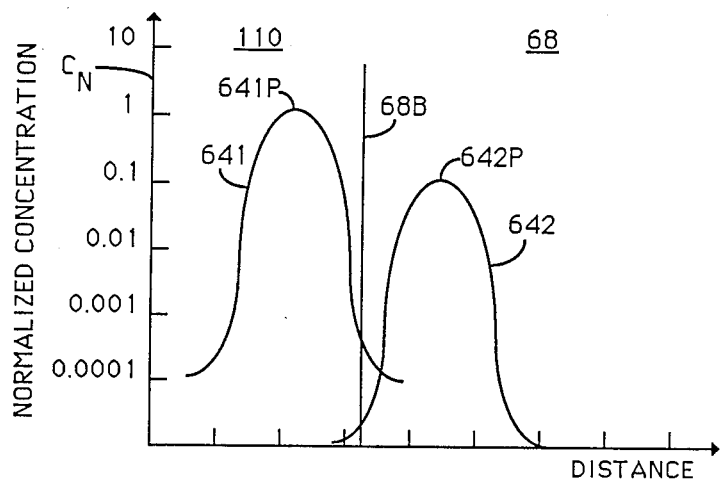
FIG. 19 illustrates schematically the relative implant dopant concentration versus distance into a typical device.

In accordance with a further aspect of the invention, transistors of improved performance are obtained using two implants of different penetrations for active base region 64 (see FIG. 12). FIG. 19 shows a graph of the normalized, as implanted, dopant concentration versus depth in screen oxide 110 and the underlying portion of epi-region 68 under opening 95 in which active base 64 is formed. One implant 641 is a high dose, low energy implant with peak concentration 641P located in screen oxide 11 at or near interface or surface 68B between oxide 110 and epitaxial layer 68 in island 82, and with the bulk of its dose in oxide 110. The other, deeper implant 642 has lower peak concentration 642P and the bulk of its dose is in epi-layer 68. This deeper implant substantially determines the Gummel number in base 64. The two base implants may also be directed into polycrystalline silicon layer 84 in base contact openings 97, 98 and serve to enhance the conductivity of the polycrystalline silicon in that region. The two base implants may be performed in either order prior to heat treatment.

The process in accordance with the invention is especially designed for high performance bipolar devices and integrated circuits although other device types can also be fabricated. To achieve the high performance level, shallow junction depths are required, and especially a shallow active base of relatively high peak impurity concentration is necessary. Control of the device characteristics requires precise control of the doping in the active (intrinsic) base region. Although ion implantation is generally accepted as a preferred doping method for accurately controlled concentrations, it is not perfect. The implanted dose may be disturbed or undesirably redistributed by subsequent processing. For example, dopant segregation into an overlying oxide during subsequent heating of an implanted region can cause a depletion of dopant from the semiconductor. This is particularly a concern when boron dopant is used in silicon. Boron segregation into the oxide can cause a significant change in the distribution and concentration of base dopants, e.g., change the Gummel number and sheet resistance of the base, particularly in the silicon near the oxide interface.

As is discussed in more detail below, if boron depletion occurs, the resistance of the extrinsic base immediately adjoining the emitter (e.g., region 117 in FIGS. 14 and 17A) can rise to unacceptably high levels. Additionally, segregation of boron into the oxide can also lower the Gummel number of shallow active base 64. This makes it difficult to control device characteristics. These problems are overcome by using the double implant described herein.

Preferably, deep implant 642 into region 68 is performed first using $B^{11}$ at about 25 KeV and a dose of about $2-3 \times 10^{13}$ cm$^{-2}$. Under these conditions, this implant has peak concentration 642P about 90 nanometers below the silicon surface 68B in epitaxial silicon region 68. This implant should place most of its dose into region 68 and is the primary determinant of the base Gummel number if segregation is prevented.

Shallow implant 641 into screen oxide 110 is desirably performed next using BF$_{2+}$ at an energy of about 20–30 KeV and a dose of about $1 \times 10^{13}$ to $1 \times 10^{14}$ cm$^{-2}$. Boron difluoride is used as the preferred dopant into screen oxide 110 because the massive molecule has a short range so that reasonable implant energies can be used and still achieve a shallow implant located mostly within the oxide. The amount of boron implanted into oxide 110 and the energy of the implant are controlled so that peak 641P of the shallow implant concentration is located in oxide 110. It is desirable that the amount of shallow implant 641 tailing into underlying silicon 68 be less than 20% of deep implant dose 642, preferably less than 10%, so that the oxide implant does not overwhelm or dominate the net doping of the active base region.

The purpose of the shallow oxide implant is to completely saturate that portion of oxide 110 near silicon-oxide interface 68B with boron so that out-diffusion of boron from region 68 into oxide 110 across interface 68B is inhibited, so that the deep boron implant remains in silicon region 68 and accurately determines the doping and Gummel number of base 64, and so that the base doping remains stable during high temperature processing or anneals before removal of oxide 110. The mechanism for this is explained in more detail below.

At diffusion temperatures, boron segregates into oxide layer 110 until the concentration at interface 68B satisfies the segregation coefficient. This results in a discontinuity in concentration at interface 68B. Boron from silicon region 68 moves into oxide 110 to adjust the oxide interface concentration upward and at the same time to adjust the silicon interface concentration downwards. As diffusion continues and boron is redistributed within silicon region 68 itself, the silicon interface concentration drops. To maintain equilibrium, the boron concentration at oxide interface 68B must also drop. Boron thus diffuses from oxide 110 into silicon region 68, with implanted oxide 110 becoming a doping source. The effect of boron saturated screen oxide 110 is thus multifold as regards boron doping in the active base.

First, saturated screen oxide 110 acts to reduce segregation of boron from silicon region 68 to oxide 110 and, second, boron saturated screen oxide 110 additionally acts as a near surface doping source. By reducing segregation from the silicon to the oxide, doped screen oxide 110 acts to keep the deep implant dopant in base region 64. The amount of boron in base 64 can thus be controlled by controlling the deep implant, since the amount of dopant desired in the base is supplied during this implant and little or none is lost to the oxide. The deep implant of known doping density will substantially remain in the silicon because of the separately doped screen oxide.

Second, the dopant in screen oxide 110 provides a means for fine tuning the dopant distribution in the active base. The fine tuning is dependent upon dopant dose, implant energy, and subsequent heat treatment. Based on the foregoing explanation, those of skill in the art will understand how to modify the deep and shallow implants to obtain the desired base doping profile and Gummel number.

Third, the doped screen oxide also serves an important function with respect to reducing the resistance between the active base region and the base contact while preserving adequate emitter-base breakdown voltage. This is explained more fully below.

The double implant process permits screen oxide 110 to be heavily boron doped without having it dominate the base Gummel number, as would be the case if a conventional deposited doped oxide were being used as a dopant source for a base diffusion. Shallower implant 641 generally has a higher concentration than deeper implant 642. This situation is illustrated in FIG. 19. The ratio of the dose of the two implants depends on the desired Gummel number and, as those of skill in the art will appreciate, the two implants may be adjusted to provide the desired Gummel number in the base while still keeping the screen oxide saturated to avoid segregation during activation of the base implant. Having a highly doped screen oxide has other advantages, as is explained below.

Portions 122 of screen oxide 110 are left behind underneath sidewall portions 120 of third poly layer 120L (see FIGS. 13–14). Portions 122 remain after the regions of oxide layers 110 and 118 under openings 95, 96 laterally within sidewall portions 120 are removed. The amount of undercutting of portions 122 beneath sidewall portions 120 may be adjusted as desired by varying the etch conditions. Once the doped oxide has been removed above active base 64 between sidewall portions 120, no further boron diffusion is possible into active base 64. Except for the effect of arsenic compensation during doping of emitter 62 from layer 126 (see FIGS. 15–18), the base Gummel number is fixed. However, during the emitter drive to form region 62, the boron available in portion 122 of oxide layer 110 continues to act as a boron source for preserving and enhancing the doping of intermediate region 117 between active base 64 and more heavily doped extrinsic base 66. This reduces the overall sheet resistance of the base while at the same time continuing to provide a buffer region between highly doped emitter 62 and highly doped extrinsic base 66. Were highly doped emitter 62 and extrinsic base regions 66 in direct contact, the emitter-base breakdown voltage would be reduced. This is undesirable. Thus, the method and structure described above make it possible to simultaneously achieve lower series base resistance while preserving emitter-base breakdown voltage. Among other things, reduced base resistance improves device speed. The foregoing are particular features of this embodiment of the present invention.

Prior to heat treatment for activation of the deep implant, the two implants may be performed in either order.

Vertical NPN transistors of the type illustrated in FIGS. 1–2 and having emitter contact opening 95 of approximately $1.5 \times 4$ micro-meters, as drawn, were constructed according to the method and arrangement described above. The resulting emitter dimensions were about $0.7 \times 3.2$ micro-meters. Such devices showed $f_t$ values of typically 15–16 GHz and dc gain values of typically 80–120. Integrated ring oscillators formed from the devices of FIGS. 1–2 exhibited typical gate propagation delays of about 70 pico-seconds at 800 microamps gate current.

Thus, it is apparent that there has been provided, in accordance with the invention, device structures and processes for their fabrication which fully meet the objects and advantages set forth above. Although the invention has been described with reference to particular embodiments and detailed steps, it is not intended that the invention be limited to these illustrative embodiments. Those skilled in the art will recognize after a review of the foregoing detailed description, that variations and modifications are possible which differ from the illustrative embodiments without departing from the spirit of the invention.

For example, the double implant doping process described above is applicable wherever dopant segregation into or out of an adjacent dielectric is desired to be prevented in connection with doping a semiconductor region in any type of a device configuration, not merely base regions of bipolar transistors. Other non-limiting exampled of doped regions where dopant segregation has historically been a problem and the method of the present invention is applicable are channel-stops and resistors. Also, other means for providing a dopant saturated screen oxide besides implanting the oxide may be used, provided that such process does not place significant dopant in the substrate and overwhelm the deep implant. Thus, high temperature deposition of a doped oxide would not be a suitable alternative because of the unavoidable base diffusion which would occur, whereas very low temperature deposition of a doped oxide would be a suitable alternative. It is intended to include within the invention and all such variations as fall within the scope of the claims which follow.

We claim:

1. A process for fabricating a semiconductor device comprising the steps of:

providing a semiconductor substrate having a surface of a first conductivity type;

forming a field insulator region having at least a first opening through which a first portion of said substrate surface is exposed;

forming on said surface a first layer, wherein said first layer is of a first material which is conductive and which can subsequently be partially converted to a dielectric;

forming a second layer overlying said first layer, wherein said second layer is of a second material which can protect first portions of said first layer while second portions of said first layer are converted to dielectric;

doping said first layer with a first dopant;

forming a third layer overlying said second layer, wherein said third layer comprises a third material which can subsequently be partially converted to a dielectric;

forming a fourth layer overlying said third layer, wherein said fourth layer is of a fourth material suitable for masking;

patterning said third and fourth layers with a master mask to define a master electrode area containing first and second contact regions, said first contact region being located at least partially within said exposed portion of said substrate surface and said second contact region being located over said field insulator region, whereby said third and fourth layers are removed in said first and second contact regions and outside said master electrode area;

removing portions of said second layer exposed outside said master electrode area to expose said second portion of said first layer;

removing remaining portions of said fourth layer within said master electrode area to expose corresponding portions of said third layer;

converting said exposed portions of said first and third layers to form a first dielectric throughout the thickness of said exposed portions;

anytime after doping said first layer, diffusing said first dopant into a first part of said first portion of said substrate to form a first device region therein;

etching portions of said first layer in said first contact region to form an opening therethrough re-exposing a second part of said first portion of said substrate surface thereunder and edges of said first layer in said opening;

forming a second dielectric on said exposed second part, and further on said edges of said first layer exposed in said first contact opening to form dielectric side-walls thereon; and using two successive implants, doping said second part of said substrate with a second dopant to form a second device region therein.

2. The process of claim 1 wherein said two successive implants comprise, in either order, (a) implanting ions of a second conductivity type into said second dielectric, and (b) implanting ions of said second conductivity type through said second dielectric and into said substrate.

3. The process of claim 2 wherein said ions implanted into said second dielectric comprise singly ionized boron difluoride.

4. The process of claim 2 wherein said ions implanted through said second dielectric comprise singly ionized boron.

5. A process for fabricating a semiconductor device comprising the steps of:

providing a semiconductor substrate having a surface region of first conductivity type;

forming an insulating field region having openings therethrough exposing portions of said surface region;

forming a first layer of polysilicon overlaying said surface and said field region;

forming a second layer of oxidation masking material overlying said first layer;

forming a third layer of polysilicon overlying said second layer;

patterning said third layer with a master mask to define first, second, and third contact regions, wherein said first and third contact regions are at least partly in registration with said openings in said field region and said second contact region is located over said insulating field region;

patterning said second and third layers to expose portions of said first layer outside said contact regions;

oxidizing said exposed portions of said first layer and remaining portions of said third layer to form a first dielectric throughout the thickness thereof;

removing portions of said first layer to form an opening therethrough to expose said surface of said substrate in said first and third contact regions;

forming a second dielectric overlying said exposed surface of said substrate and said first layer including the edges of said first layer exposed in said opening to said first and third contact regions;

forming a spacer on said second dielectric on said edges of said first layer laterally decreasing the size of said opening;

anytime after said patterning step, but before said step of forming a spacer, doping said substrate adjacent said first contact region to form a first device region in said substrate;

forming in said substrate a second device region of the same type as said first device region and located contiguous with said first device region and wherein said second device region is located laterally within said first device region; and wherein said step of forming said second device region comprises forming said second device region by at least two ion implantations of different penetrations, in either order, one principally into said second dielectric overlying said exposed surface and another principally through said second dielectric overlying said exposed surface and into said silicon substrate.

6. The process of claim 5 wherein said one implantation comprises singly ionized boron difluoride and said another implantation comprises singly ionized boron.

7. A process for forming semiconductor device regions, comprising:
providing a semiconductor substrate having,
a principal surface,
a first conductivity type and first concentration,
a first region of a second conductivity type and second concentration and comprising two spaced apart portions extending to the surface and separated by a second region of the substrate,
a first layer on the surface with a first opening of first lateral size above the second region wherein the first opening has a first sidewall extending to the second region, and
a second layer on the surface of the second region in the first opening;
then, in either order through the first opening,
implant doping the second layer with a first dopant of the second conductivity type having a third concentration whereby a peak of the third concentration is located in the second layer near the substrate surface, and
implant doping the second region with a second dopant of the second conductivity type having a fourth concentration wherein a peak of the fourth concentration is located in the second region;
then, in either order,
heating the substrate to activate the second dopant in the second region, and
adding additional material to the first sidewall to reduce the first lateral size of the first opening to provide a second opening of smaller second lateral size and with a second sidewall extending to the second layer; and
thereafter, removing a first part of the second layer to expose a third region of the substrate beneath the second opening while leaving in place a second part of the second layer laterally outside the second opening.

8. The process of claim 7 further comprising doping the third region of the substrate with a third dopant of the first type to a fifth concentration larger than the fourth concentration.

9. The process of claim 7 further comprising providing a source of a third dopant in the second opening in contact with the third region of the substrate and doping the third region of the substrate therefrom.

10. The process of claim 7 wherein the steps of implant doping the second layer and the second region comprise providing doses so that the third concentration exceeds the fourth concentration.

11. The process of claim 7 wherein the first region is more heavily doped than the second region.

12. The process of claim 9 wherein the source of the third dopant comprises doped polycrystalline semiconductor.

13. A process for forming semiconductor devices, comprising:
providing a semiconductor substrate having a principal surface, having a first conductivity type and first concentration, having a first region with dopant of a second conductivity type and second concentration and comprising two spaced apart portions extending to the substrate surface and wherein the two spaced apart portions are separated by a second region of the substrate, having a first layer on the substrate surface with a first opening of first lateral size above the second region and wherein the first opening has a sidewall extending through the first layer to the second region, and having an oxide layer on the substrate surface in the second region;
then, in either order through the first opening, doping the oxide layer with a further dopant of the second type having its peak concentration in the oxide layer near the substrate surface, and doping the second region with a still further dopant of the second type having its peak concentration below the substrate surface in the second region;
then, in either order, heating to activate the dopant in the second region, and adding additional material to the sidewall so as to reduce the first lateral size of the first opening to provide a second opening of smaller second lateral size extending to the oxide layer;
thereafter removing a first part of the oxide layer beneath the second opening to expose a third region of the substrate located beneath the second opening and extending to the substrate surface while leaving in place a second part of the oxide layer located on the substrate surface laterally between the first and third regions; and
thereafter heating the second part of the oxide layer to prevent out-diffusion of dopant from the second region between the first and third regions.

14. The process of claim 13 wherein the step of doping the second region with a still further dopant of the second type comprises providing such still further dopant in the second region without providing such still further dopant in the first region.

15. A process for controlled doping of a device region that comprises the steps of:
providing a semiconductgor substrate having a surface and having first and second regions extending to the surface, wherein the first region is located laterally within and in contact with the second region;
covering the first and second regions with a first layer of a first predetermined thickness;
removing a portion of the first layer to provide a first opening in the first layer exposing the first region but not the second region;
forming a penetrable second layer on the exposed first region;
then, in either order, implanting a first shallow dose of a first dopant impurity of a first conductivity type into th ⓡsecond layer so that the peak concentration of the shallow implant is located in the second layer, and implanting a second deeper dose of a second dopant impurity of the first conductivity type through the second layer into the first region so that the peak concentration of the deeper implant is located in the first region; and
wherein neither the shallow nor deeper implants penetrate the first layer to the second region.

16. The process of claim 1 wherein the shallow implant dose is higher than the deeper implant dose.

17. The process of claim 16 wherein the first dopant impurity comprises singly ionized BF$_2$.

18. The process of claim 17 wherein the second dopant impuity comprises singly ionized boron.

19. A process for controlled doping of a device region that comprises the steps of:
    providing a semiconductor substrate having a surface and having first and second regions extending to the surface, wherein the first region is laterally surrounded by the second region;
    covering the first and second regions with a first layer of a first predetermined thickness;
    removing a portion of the first layer to provide a first opening in the first layer exposing the first region but not the second region;
    forming a penetrable second layer of oxide on the exposed first region;
    then, in either order, substantially saturating the portion of the oxide layer in contact with the first region with a first impurity dopant, and implanting a second impurity dopant of the same conductivity type as the first dopant through the oxide layer into the first region but not into the second region.

20. The process of claim 19 wherein the step of substantially saturating the oxide layer in contact with the first region comprises ion implanting the first impurity dopant at an energy to locate the peak concentration of the first impurity dopant in the oxide layer and adjacent the first region but not penetrating the first layer.

21. The process of claim 19 further comprising removing a central portion of the oxide layer above a central portion of the first region leaving a peripheral portion of the oxide layer in contact with a peripheral portion of the first region.

22. The process of claim 21 further comprising, doping the central portion of the first region with a further dopant of opposite conductivity type while the peripheral portion of the oxide layer remains in contact with the peripheral portion of the first region.

* * * * *